United States Patent
Lopez et al.

(10) Patent No.: US 9,921,265 B2
(45) Date of Patent: Mar. 20, 2018

(54) THERMAL CLUTCH FOR THERMAL CONTROL UNIT AND METHODS RELATED THERETO

(71) Applicant: Sensata Technologies, Inc., Attleboro, MA (US)

(72) Inventors: Christopher A. Lopez, Phoenix, AZ (US); Rick A. Davis, Peoria, AZ (US)

(73) Assignee: Sensata Technologies, Inc., Attleboro, MA (US)

( * ) Notice: Subject to any disclaimer, the term of this patent is extended or adjusted under 35 U.S.C. 154(b) by 37 days.

(21) Appl. No.: 14/973,900

(22) Filed: Dec. 18, 2015

(65) Prior Publication Data

US 2017/0176515 A1    Jun. 22, 2017

(51) Int. Cl.
| | | |
|---|---|---|
| *G01R 31/28* | (2006.01) | |
| *G01R 1/04* | (2006.01) | |
| *G01R 31/26* | (2014.01) | |
| *H01L 23/34* | (2006.01) | |
| *H01L 23/42* | (2006.01) | |

(52) U.S. Cl.
CPC ....... *G01R 31/2874* (2013.01); *G01R 1/0458* (2013.01); *G01R 31/26* (2013.01); *G01R 31/2891* (2013.01); *H01L 23/345* (2013.01); *H01L 23/42* (2013.01)

(58) Field of Classification Search
CPC ............ G01R 31/2874; G01R 31/2875; G01R 31/2877; G01R 1/07378; G01R 31/003; G01R 1/0425; G01R 1/07314; G01R 31/2851
USPC ............... 324/750.03, 750.04, 750.09, 750.1
See application file for complete search history.

(56) References Cited

U.S. PATENT DOCUMENTS

| | | | |
|---|---|---|---|
| 4,802,370 A | 2/1989 | Eernisse et al. | |
| 5,198,753 A | 3/1993 | Hamburgen | |
| 5,821,505 A | 10/1998 | Tustaniwskyj et al. | |
| 6,184,504 B1 | 2/2001 | Cardella | |

(Continued)

FOREIGN PATENT DOCUMENTS

| | | |
|---|---|---|
| EP | 0890843 | 1/1999 |
| JP | 2012185184 | 9/2012 |
| KR | 2010 0115266 | 10/2010 |

OTHER PUBLICATIONS

European Search Report dated Jun. 14, 2017 for European Patent Application No. 16201793, 12 pages.

Primary Examiner — Tung X Nguyen
Assistant Examiner — Robert P Alejnikov, Jr.
(74) Attorney, Agent, or Firm — Burns & Levinson LLP; Joseph M. Maraia; George N. Chaclas

(57) ABSTRACT

Featured are devices, systems and methods for testing an electronic device, such as an integrated chip. Such a testing method includes disposing a thermal clutch between a variable heat sink that absorbs heat energy and a heat source member that selectively delivers heat energy. When the thermal clutch is operated in a first manner the thermal clutch thermally couples the variable heat sink to the electronic device under test (DUT) and when operated in the second manner, the thermal clutch thermally de-couples the variable heat sink from the DUT. Also, when the thermal clutch is operated in the second manner, the heat source member is thermally coupled to the DUT and is operated so as to produce heat energy which is thus provided to the thermally coupled DUT.

9 Claims, 8 Drawing Sheets

(56) References Cited

U.S. PATENT DOCUMENTS

| | | |
|---|---|---|
| 6,498,899 B2 | 12/2002 | Malinoski et al. |
| 6,636,062 B2 | 10/2003 | Gaasch et al. |
| 6,914,446 B1 * | 7/2005 | Tustaniwskyj ..... G01R 31/2874 324/750.09 |
| 6,975,028 B1 | 12/2005 | Wayburn et al. |
| 6,993,922 B2 | 2/2006 | Wall et al. |
| 7,030,640 B2 | 4/2006 | Yee et al. |
| 7,100,389 B1 | 9/2006 | Wayburn et al. |
| 7,178,651 B2 | 2/2007 | Leon |
| 7,199,597 B2 | 4/2007 | Tustaniwskyj et al. |
| 7,259,580 B2 | 8/2007 | Aube et al. |
| 7,373,967 B1 | 5/2008 | Tustaniwskyj et al. |
| 7,804,316 B2 | 9/2010 | Ito et al. |
| 7,921,906 B2 | 4/2011 | Maruyama et al. |
| 8,151,872 B2 | 4/2012 | Di Stefano |
| 8,274,300 B2 | 9/2012 | Sakaue et al. |
| 8,779,793 B2 | 7/2014 | Shin et al. |
| 8,844,612 B2 | 9/2014 | Tani et al. |
| 9,341,671 B2 | 5/2016 | Wang et al. |
| 9,500,701 B2 | 11/2016 | Tustaniwsky et al. |
| 9,594,113 B2 | 3/2017 | Davis et al. |
| 9,609,693 B2 | 3/2017 | Clairet et al. |
| 9,677,822 B2 | 6/2017 | Yosef et al. |
| 9,709,622 B2 | 7/2017 | Lopez et al. |
| 2004/0012404 A1 * | 1/2004 | Feder ................ H01L 21/67248 324/750.07 |
| 2005/0146708 A1 | 7/2005 | Shi et al. |
| 2008/0191729 A1 | 8/2008 | Blanco et al. |
| 2011/0011564 A1 | 1/2011 | Ooi et al. |
| 2014/0260333 A1 * | 9/2014 | Lopez .................... F28D 15/02 62/3.6 |
| 2015/0122469 A1 | 5/2015 | Jensen et al. |
| 2015/0309112 A1 * | 10/2015 | Goh .................. G01R 31/2874 324/750.08 |

* cited by examiner

US 9,921,265 B2

THERMAL CLUTCH FOR THERMAL CONTROL UNIT AND METHODS RELATED THERETO

FIELD OF INVENTION

The present invention relates to methods, systems and devices for testing of an electronic device such as an integrated chip (IC) that controls the temperature of the electronic device during such testing. More particularly the present invention relates to methods, systems and devices that embody a thermal clutch that thermally couples a cooling member to the electronic device, more specifically an IC, under certain test conditions and that under other test conditions thermally de-couples the electronic device or IC from the cooling member and so the electronic device can thereafter be heated for testing under such temperature conditions.

BACKGROUND OF THE INVENTION

Electronic devices including integrated chips (ICs) undergo various forms of testing during the development of such a device as well as a part of the manufacturing process for such a device. Such developmental testing can include testing to determine the suitability or capability of the device to operate in the intended manner under expected operating conditions such as a range of environmental temperature conditions. Such manufacturing related testing can include testing to determine operational characteristics of the device, the acceptability of same and to verify operational capability under differing temperature conditions.

Because such electronic devices are used together with other electrical/electronic components to form a specific operational device, it is desirous to determine the functional acceptability of a given electrical/electronic device/component before it is combined with other components to minimize the potential for the failure of the specific operational device. For example, one would want to verify the operational capability of an IC for use in an engine control module (ECU) before the ECU is assembled to minimize the number of ECUs that could be rejected for a defective IC. Such testing also would be done in the case where one was developing an electronic device/component to determine its acceptability for the intended use.

As indicated above such testing can include controlling temperature conditions of the electronic device to cover the expected or design environmental range of temperatures such as for developmental testing, a range of temperatures for manufacturing testing and a design operational temperature for determining operational characteristics of the electronic device. For example, some integrated chips are provided with some form of cooling (e.g., fan) to dissipate the heat energy being developed by the IC and/or other circuitry so the IC is maintained at or below a specific temperature. Thus, testing at the specific temperature would be suitable for determining operational characteristics.

Consequently various devices and/or methods have been developed to control the temperature of an electronic device such as an IC to simulate design environmental temperature conditions for the electronic device or IC. One technique and related devices involves the use of a thermoelectric controller (TEC) or TEC module which embodies the Peltier effect and which can be used to control over a range of temperatures. More specifically, a TEC module has been conventionally used with a coolant plate to provide this wide temperature range. However, the use of a TEC necessarily limits the maximum thermal transfer capability as well as being prone to failure. Moreover, as the DC flow in the TEC needs to be switched to switch the TEC between cooling and heating, a time delay results between the heating and cooling phases which time delay necessarily means lengthening of testing times.

There is found in U.S. Pat. No. 5,821,505 a temperature control system that comprises an electric heater that has a first face which makes contact with an electronic device, and a second face which is opposite the first face; a heat sink, coupled to the second face of the heater, which absorbs heat from the electronic device through the heater's second face; and a temperature sensor, coupled to the electronic device which senses the device temperature $T_d$. A control circuit is coupled to the device temperature sensor and to the heater. It decreases the power to the heater when the sensed temperature of the electronic device is above the set point, and vice-versa. When the heater temperature $T_h$ is less than $T_d$, then heat flows from the electronic device through the heater to the heat sink; and the rate of heat flow increases as $T_d$-$T_h$ increases. When $T_h$ is more than $T_d$, then heat flows to the electronic device from the heater; and the rate of heat flow increases as $T_h$-$T_d$ increases It thus would be desirable to provide a new thermal control unit or device and methods related thereto that can control a wide temperature range without using a TEC module. It would be particularly desirable to provide such a device and method that would embody a thermal clutch mechanism that would allow selective thermal coupling of a cooling device to a device under test (DUT) thereby allowing for cooling of the DUT and to decouple the cooling device from the DUT when the DUT is to be in a heating mode, thereby allowing a full temperature range during testing of the DUT. Such collection devices preferably would be no more complex construction as prior art devices and be significantly more costly than prior art devices. Also such methods would not require users to be significantly more skilled that conventional methods or for those utilizing prior art devices.

SUMMARY OF THE INVENTION

The present invention features devices, systems and methods for testing an electronic device, such as an integrated chip. Such a testing method includes disposing a thermal clutch between a variable heat sink that absorbs heat energy and a heat source member that selectively delivers heat energy. The thermal clutch is operated so that when in a first condition or configuration the thermal clutch thermally couples the variable heat sink to the electronic device under test (DUT) and when operated so that it is in a second condition or configuration, the thermal clutch thermally de-couples the variable heat sink from the DUT. When the thermal clutch is so de-coupled, the heat source is thermally coupled to the DUT. As further described herein, in further embodiments, the thermal clutch is operated to control the amount or extent of thermal coupling so as to thereby also control the amount of heat energy being absorbed by the variable heat sink.

According to one aspect of the present invention there is featured a method for testing an electronic device, such as an integrated chip. Such a testing method includes disposing a thermal clutch between a variable heat sink that absorbs heat energy and a heat source member that selectively delivers heat energy. Such a method further includes selectively operating the thermal clutch in one of a first manner or a second manner. When operating the thermal clutch in the first manner, the thermal clutch thermally couples the variable heat sink to the DUT and when operating the thermal clutch in the second manner, the thermal clutch thermally de-couples the variable heat sink from the DUT. Also, when the thermal clutch is being operated in the second manner, the heat source member is thermally coupled to the DUT and is operated so as to produce heat energy which is thus provided to the thermally coupled DUT.

In yet further embodiments, such selectively operating the thermal clutch in the first manner includes controlling the amount or extent of thermal coupling between the heat sink and the DUT so as to thereby also control the amount of heat energy being absorbed by the variable heat sink. In one embodiment such controlling includes controlling such thermal coupling so that a predetermined amount of thermal coupling is achieved. In another embodiment, such controlling includes variably controlling such thermal coupling so that any one or more of a different amounts of thermal coupling is achieved. In further embodiments, such controlling includes monitoring a temperature associated with such thermal coupling and varying the amount of thermal coupling so as to achieve a desired temperature. It should be recognized that such thermal coupling can be controlled so as to allow any of a number of different thermal couplings such as for example a controlled step-change over time.

In further embodiments, such a method includes maintaining operation of the variable heat sink while the thermally clutch is de-coupling the variable heat sink from the DUT and the heat source member. In yet further embodiments, when the variable heat sink is thermally coupled to the DUT, the thermal clutch thermally couples the variable heat sink to the heat source member and said method further includes configuring the heat source member so it does not generate heat energy.

In yet further embodiments, the variable heat sink comprises a coolant evaporator and said method further includes controlling the coolant evaporator so as to control a temperature of the DUT.

In yet further embodiments, the thermal clutch includes a first mechanism that is configured and arranged to move the variable heat sink in a first direction so as to thermally couple the variable heat sink and the DUT and a second mechanism that is configured and arranged to move the variable heat sink in a second direction so as to thermally de-couple the variable heat sink from the DUT.

In yet further embodiments, the thermal clutch includes a first mechanism that is configured and arranged to move the variable heat sink in a first direction so as to thermally couple the variable heat sink and the heat source member and a second mechanism that is configured and arranged to move the variable heat sink in a second direction so as to thermally de-couple the variable heat sink from the heat source member.

In yet further embodiments, the first mechanism is configured and arranged to selectively move the heat sink so as control the amount or extent of thermal coupling between the heat sink and the DUT and/or heat source member and so as to thereby also control the amount of heat energy being absorbed by the heat sink. In one embodiment the first mechanism is configured and arranged so as to move the heat sink in the first direction so that a predetermined amount of thermal coupling is achieved. In another embodiment, the first mechanism is configured and arranged to variably control such movement of the heat sink so that any one or more of a different amounts of thermal coupling is achieved. In further embodiments, a temperature associated with such thermal coupling is monitored and the first mechanism is configured and arranged so as to vary the amount of thermal coupling responsive to the monitored temperature so as to achieve a desired temperature from such thermal coupling. It should be recognized that such thermal coupling can be controlled so as to allow any of a number of different thermal couplings.

In yet further embodiments, such a method further includes applying a force to the DUT so as to place the DUT into electrical contact with a device testing apparatus, the force being applied is independent of action by the thermal clutch.

In yet further embodiments, such a method further includes thermally coupling an adapter member to the heat source member and the DUT, the adapter member being configured and arranged for thermal coupling to a given DUT.

In yet further aspects/embodiments, the method is such that the method is carried out for a DUT that is an integrated chip.

According to another aspect/embodiment of the present invention there is featured a device for testing an electronic device. Such a testing device includes a movable member including a heat sink and a second member being configured and arranged so as to be thermally coupled to a device being tested (DUT), which second member also includes a heat source that can selectively deliver heat energy to the DUT. Such a testing device also includes a thermal clutch that includes a moving mechanism that is operably coupled to the movable member. The moving mechanism is configured and arranged such that when the thermal clutch is being operated in a first manner, the moving mechanism urges the movable member into contact with the second member and when the thermal clutch is being operated in a second manner, the moving mechanism moves the movable member out of contact with the second member.

In yet further embodiments, the moving mechanism is configured and arranged such that when the thermal clutch is being operated in the first manner, the moving mechanism selectively moves the movable member so as control the amount or extent of thermal coupling between the heat sink and the second member and so as to thereby also control the amount of heat energy being absorbed by the heat sink. In one embodiment the moving mechanism is configured and arranged so as to move the movable member so that a predetermined amount of thermal coupling is achieved. In another embodiment, the moving mechanism is configured and arranged to variably control such movement of the movable member so that any one or more of a different amounts of thermal coupling is achieved. In further embodiments, a temperature associated with such thermal coupling is monitored and the moving mechanism is configured and arranged so as to vary the amount of thermal coupling responsive to the monitored temperature so as to achieve a desired temperature from such thermal coupling. It should be recognized that such thermal coupling can be controlled so as to allow any of a number of different thermal couplings.

In further embodiments, such a testing device further includes a control mechanism that controls operation of the heat sink and the heat source such that when the movable member is in contact with the second member, the control mechanism is configured and arranged so the heat source does not produce heat energy and so as to control the amount of heat energy being absorbed by the heat sink.

In yet further embodiments, such a control/controlling mechanism is further configured and arranged so that when the movable member is moved out of contact with the second member, the heat sink is controlled so as to remain operable and the heat source is controlled so as to selectively produce a desired amount(s) of heat energy.

In yet further embodiments, the heat sink includes a coolant evaporator and such a testing device further includes an evaporator control device that is configured and arranged so as to control the coolant evaporator so as to thereby also control a temperature of the DUT during testing.

In yet further embodiments, such a moving mechanism includes a first mechanism that is configured and arranged to move the movable member in a first direction so as to thermally couple the movable member to the second member and thus to the DUT. Such a moving mechanism also includes a second mechanism that is configured and arranged to move the movable member in a second direction so as to move the movable member out of contact with the second member and thus thermally de-couple the movable member from the DUT. In further embodiments, the second member further includes an adapter member the adapter member being configured and arranged for thermal coupling to a given DUT.

In yet further aspects/embodiments, the DUT is an integrated chip.

According to another aspect/embodiment of the present invention, there is featured a system for testing an electronic device. Such a system includes a testing device that is configured and arranged so as to selectively and controllably thermally couple a device under test (DUT) to one of a heat sink or a heat source. The heat sink or variable heat sink comprises a heat absorbing device (e.g., coolant evaporator) that is operably coupled to the testing device so as to absorb heat energy during testing of the DUT. Such a system also includes a heat generating device that comprises the heat source and which is operably coupled to the testing device so as to provide heat energy during testing of the DUT. As described further herein, such a system is operated so as to selectively absorb heat energy or selectively provide heat energy so as to control the temperature of the DUT. In illustrative embodiments, the DUT is an integrated chip.

Such a testing device includes a movable member including a heat sink, a second member being configured and arranged so as to be thermally coupled to a device being tested (DUT), which second member also includes a heat source that can selectively deliver heat energy to the DUT and a thermal clutch that includes a moving mechanism that is operably coupled to the movable member. Also, the moving mechanism is configured and arranged such that when the thermal clutch is being operated in a first manner, the moving mechanism urges the movable member into contact with the second member and when the thermal clutch is being operated in a second manner, the moving mechanism moves the movable member out of contact with the second member.

In yet further embodiments, the moving mechanism is configured and arranged such that when the thermal clutch is being operated in the first manner, the moving mechanism selectively moves the movable member so as control the amount or extent of thermal coupling between the heat sink and the second member and so as to thereby also control the amount of heat energy being absorbed by the heat sink. In one embodiment the moving mechanism is configured and arranged so as to move the movable member so that a predetermined amount of thermal coupling is achieved. In another embodiment, the moving mechanism is configured and arranged to variably control such movement of the movable member so that any one or more of a different amounts of thermal coupling is achieved. In further embodiments, a temperature associated with such thermal coupling is monitored and the moving mechanism is configured and arranged so as to vary the amount of thermal coupling responsive to the monitored temperature so as to achieve a desired temperature from such thermal coupling. It should be recognized that such thermal coupling can be controlled so as to allow any of a number of different thermal couplings.

In yet further aspects/embodiments, such a system further include a control device that controls operation of the heat absorbing device and the heat generating device. When the movable member is put into contact with the second member, the control mechanism is configured and arranged so the heat generating device does not produce heat energy and so as to control the amount of heat energy being absorbed by the heat absorbing device.

In addition, such a controlling mechanism is further configured and arranged such that when the movable member is moved out of contact with the second member, the heat absorbing device is controlled so as to remain operable and the heat generating device is controlled so as to selectively produce a desired amount(s) of heat energy. In yet further embodiments, such a heat absorbing device includes a coolant evaporator and such a testing system further includes an evaporator control device that is configured and arranged so as to control the coolant evaporator so as to thereby also control a temperature of the DUT during testing.

In yet further embodiments, the moving mechanism includes a first mechanism that is configured and arranged to move the movable member in a first direction so as to thermally couple the movable member to the second member and thus to the DUT, and a second mechanism that is configured and arranged to move the movable member in a second direction so as to move the movable member out of contact with the second member and thus thermally de-couple the movable member from the DUT. In further embodiments, the second member further includes an adapter member. The adapter member is configured and arranged for thermal coupling to a given DUT.

Other aspects and embodiments of the invention are discussed below.

DEFINITIONS

The instant invention is most clearly understood with reference to the following definitions:

USP shall be understood to mean U.S. Patent Number and U.S. Publication No. shall be understood to mean U.S. Published Patent Application Number.

The terms "comprising" and "including: as used in the discussion directed to the present invention and the claims are used in an open-ended fashion and thus should be interpreted to mean "including, but not limited to." Also the terms "couple" or "couples" is intended to mean either an indirect or direct connection. Thus if a first component is coupled to a second component, that connection may be through a direct connection, or through an indirect connection via other components, devices and connections. Further the terms "axial" and "axially" generally mean along or substantially parallel to a central or longitudinal axis, while the terms "radial" and "radially" generally mean perpendicular to a central, longitudinal axis.

Additionally directional terms such as "above," "below," "upper," "lower," etc. are used for convenience in referring to the accompanying drawing figures. In general, "above," "upper," "upward" and similar terms refer to a direction toward a proximal end of an instrument, device, apparatus or system and "below," "lower," "downward," and similar terms refer to a direction toward a distal end of an instrument, device, apparatus or system, but is meant for illustrative purposes only and the terms are not meant to limit the disclosure.

DUT shall be understood to mean device under test and is a term commonly used to refer to a manufactured product undergoing testing. DUT also is known as equipment under test (EUT) and unit under test (UUT). The term DUT is used within the electronics industry to refer to any electronic assembly under test, for example, cell phones coming off an assembly line may be given a final test in the same way as the individual chips were earlier tested. The DUT is often connected to the test equipment using a bed of nails tester or pogo pins. In semiconductor testing, the device under test is a die of a wafer or the resulting packaged part. A connection system is typically used that connects the part to automatic or manual test equipment. The test equipment then applies power to the part, supplies stimulus signals, and then measures and evaluates the resulting outputs from the device. While packaged as a wafer the automatic test equipment can connect to the individual units using a set of microscopic connectors such as needles. Once the chips are parted (e.g., sawn apart) and packaged, the test equipment may use other means (e.g., ZIF sockets or connectors) to connect to the chips.

DUT board shall be understood to mean or refer to a board that is used in automated integrated circuit testing where the term DUT refers to device under testing, also referring to the circuit being tested. A DUT board typically is a printed circuit board and is the interface between the integrated circuit to be tested and a test head, which in turn attaches to automatic test equipment (ATE). Such DUT boards also are typically designed so as to meet both the mechanical and electrical requirements of the particular chip and specific test equipment to be used. For example, one type of DUT board can be used in testing the individual die or dice of a silicon wafer before they are cut free and packaged while another type can be used for testing packaged integrated circuits. DUT boards also are occasionally known as DIBs or device interface boards.

The term direct current (DC) is used to represent the unidirectional flow of an electric charge. Although DC stands for "direct current", DC often refers to "constant polarity". Under this definition, DC voltages can vary in time, as seen in the raw output of a rectifier or the fluctuating voice signal on a telephone line. Direct current is produced by sources such as batteries, power supplies, thermocouples, solar cells or dynamos. Direct current may flow in a conductor such as a wire, but can also flow through semiconductors insulators, or even through a vacuum as in electron or ion beams. The electric current flows in a constant direction, distinguishing it from alternating current. A term formerly used for this type of current flow was galvanic current. Although some forms of DC (such as that produced by a voltage regulator) have almost no variations in voltage, they may still have variations in output power and current. Some common applications or uses for direct current is charging of batteries and as a power supply for electronic systems. Most automotive applications use DC by means for example of an alternator (an AC device) which uses a rectifier to produce DC (e.g., 12V DC). The abbreviation DC is often used to simply mean direct such as when they are used as an adjective to modify current and voltage.

In electronics, it is common to refer to a circuit that is powered by a DC voltage source such as a battery or the output of a DC power supply, as a DC circuit even though what is meant is that the circuit is DC powered. More particularly, a direct current circuit is an electrical circuit that consists of any combination of constant voltage sources, constant current sources, and resistors. In such a case, the circuit voltages and currents are independent of time.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein.

DESCRIPTION OF THE PREFERRED EMBODIMENT

Figure 1:
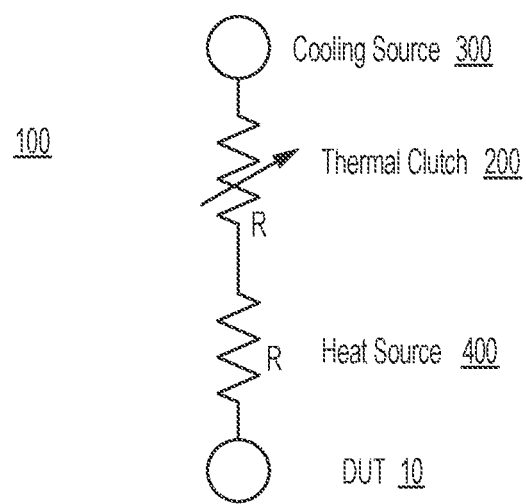
FIG. 1 is a schematic view illustrating the functional elements comprising the thermal control unit according to the present invention and in particular the relationship of the thermal clutch to the cooling and heating elements of such a thermal control unit.

Referring now to the various figures of the drawing wherein like reference characters refer to like parts, there is shown in FIG. 1 a schematic view illustrating the functional elements comprising a thermal control unit 100 according to the present invention and in particular the relationship of the thermal clutch 200 to the cooling and heating mechanisms 300, 400 of such a thermal control unit. Such a thermal control unit 100 is particularly configured so as to selectively heat and cool a device under test (DUT) 10. While the following may describe the DUT 10 as an integrated circuit (IC) this shall be not limiting as it is within the scope of the present invention for the DUT 10 to comprise a silicon wafer including a plurality or a multiplicity of such ICs, IC packages and other electronic devices for which testing under different temperatures (hot or cool) are contemplated.

In more particular aspects, a thermal control unit 100 is configured and arranged so as to selectively couple a cooling source 300 or variable heat sink to the DUT 10 in one operating mode or condition and to selectively couple a heating source 400 to the DUT 10 while the cooling source 300 is thermally de-coupled from the DUT 10 in another operating mode or condition. In this way, and contrary to conventional thermal element control modules, the DUT 10 can be selectively heated or cooled over a wider temperature range using the thermal control unit 100 of the present invention than that which can be achieved using such conventional thermal control element modules. Further and in contrast to conventional modules, the source of cooling need not be stopped or ended while heating the DUT 10 as is required using such conventional thermal control element modules. In further embodiments, the thermal control unit 100 is operated to control the amount or extent of thermal coupling between the cooling source 300 or variable heat sink and the DUT 10 so as to thereby also control the amount of heat energy being absorbed by the cooling source 300.

In yet more particular aspects, such a thermal control unit 100 includes a thermal clutch 200 that is located between a cooling source 300 and a heater or heat source 400. Such a thermal clutch 200, as further described herein below in connection with FIGS. 2-6, is configured and arranged so as to be operated in one of two operating modes or conditions. In one, or a first operating mode (e.g., cooling mode), the thermal clutch 200 is operated so the cooling source 300 is thermally coupled to the DUT 10 and the cooling source 300 is operated so as to control the temperature of the DUT 10 so it is at or about a desired test temperature. In this operating mode the heaters or heating elements comprising the heat source 400 are not operated. In other words, the heat source's 400 operational mode is such that no heat energy is being developed and distributed to the DUT 10.

The desired test temperature can be a desired operating temperature for the DUT 10 as it would be when it is being operated normally. The desired test temperature also can be a temperature or a range of temperature that reflects possible environmental conditions, for example extreme cold operating environments the DUT 10 might experience in actual or anticipated use. The desired test temperature also could be a predetermined temperature or range of temperatures for testing the DUT 10 to determine its acceptability to meet set or design operational requirements (e.g., provide an output signal at a desired voltage within a set period of time).

When operating in the first operating mode, selectively operating the thermal clutch 200 further includes controlling the amount or extent of thermal coupling between the cooling source 300 or heat sink and the DUT 10 so as to thereby also control the amount of heat energy being absorbed by the cooling source 300 or variable heat sink. In one embodiment such controlling includes controlling thermal coupling so that about a predetermined amount of thermal coupling is achieved. In another embodiment, such controlling includes selectively, variably controlling thermal coupling so that any one or more of a different amounts of thermal coupling is achieved. Further, such controlling includes monitoring a temperature associated with thermal coupling and varying the amount of thermal coupling so as to achieve a desired temperature associated with a given level, extent or amount of thermal coupling. It should be recognized that such thermal coupling can be controlled so as to allow any of a number of different thermal couplings such as for example a controlled step-change over time.

In the another or second operating mode (e.g., heating mode), the thermal clutch 200 is operated so the cooling source 300 is thermally de-coupled from the DUT 10 and the heating source 400 is operated so as to control the temperature of the DUT 10 so it is at or about a desired test temperature. In this operating mode the heater or heat source 400 is operated to produce enough heat energy so as to heat the DUT 10 to the desired test temperature.

The desired test temperature when the DUT 10 is being heated can be a desired operating temperature for the DUT 10 as it would be when it is being operated normally. The desired test temperature also can be a temperature or a range of temperature that reflects possible environmental conditions, for example extreme hot operating environments the DUT 10 might experience in actual or anticipated use. The desired test temperature also could be a predetermined temperature or range of temperatures for testing the DUT 10 to determine its acceptability to meet set or design operational requirements (e.g., provide an output signal at a desired voltage within a set period of time).

In the second operating mode (e.g., heating mode), the cooling source 300 can be operated in any of a number of operating modes. For example, the cooling source 300 could be operated so as to be maintained in a standby condition, an off condition or any other temperature condition that is otherwise appropriate. In the standby or other temperature condition, as the cooling source 300 is not directly thermally coupled to the DUT 10 by the thermal clutch 200, the cooling source 300 is not removing heat energy from the DUT 10 and therefore, is not cooling the DUT 10. Therefore, the cooling source 300 can be operated under these conditions in anticipation of another test cycle so as to reduce the testing time as well as any undesirable operational characteristics that might occur when the cooling source 300 is turned off. For example, if using an evaporative type of cooling source there could be an operational time delay between when the unit is turned off and when it can be cycled back on.

As described further herein, the cooling source 300 in effect forms a variable heat sink that can be adjusted to absorb different quantities of heat energy from the DUT 10 so as to thereby control the temperature of the DUT 10. For example, the cooling source 300 can be operated so as to absorb the heat energy being developed to maintain the DUT 10 at a desired operating temperature or the cooling source 300 can be operated such that the DUT 10 is being operated at colder temperatures. In a more particular embodiment, the heat source 300 comprises any of a number of cooling devices as are known in the art. More specifically, the cooling source 300 is a coolant evaporator as is known in the art and appropriate for the intended use.

The heating source 400 described herein can include a thermal plate 402 or the like and/or an interface plate 520 that are designed and configured to cooperate with the thermal clutch 200 so that the cooling source 300 is selectively thermally coupled to and thermally de-coupled from the DUT 10. As further described herein, heating elements 410 are provided which comprise the source of heat energy. The heating elements 410 are disposed in the thermal plate 402 and/or the interface plate 520 so the heat energy being produced can be distributed therefrom to the DUT 10. In more particular embodiments, one or more, more specifically a plurality or a multiplicity of heating elements 410 are located in the thermal plate 402. In yet more specific embodiments, the heating source 400 more particularly includes two or four heating elements 410 (see FIGS. 3 and 8B).

Figure 4:
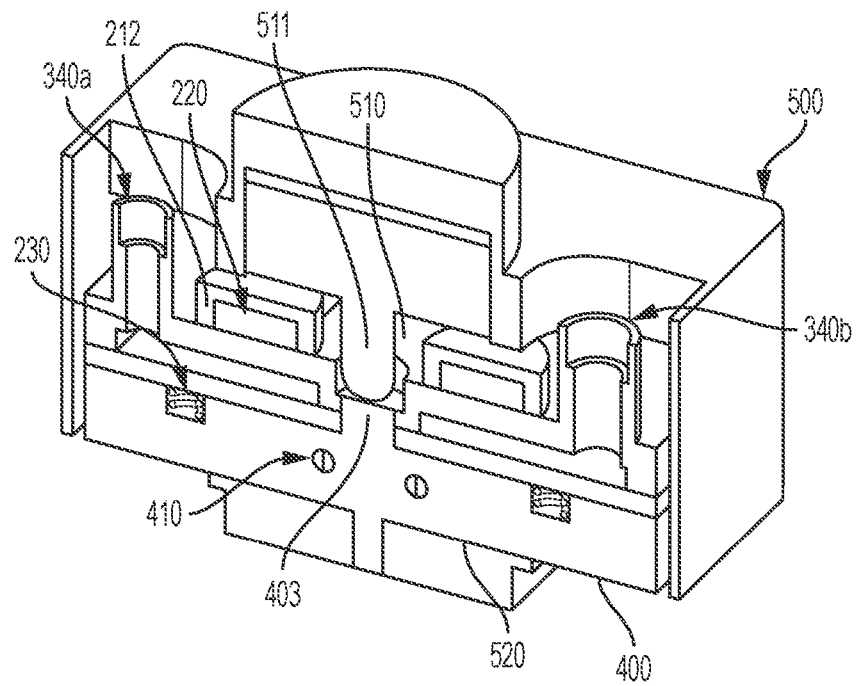
FIG. 4 is another axonometric cross-sectional view of thermal control unit of FIGS. 2A, B.
Figure 5:
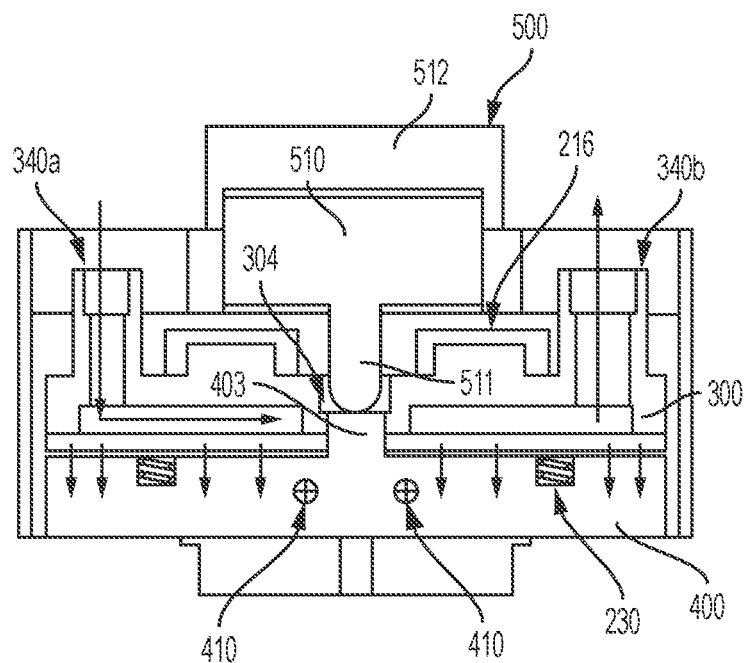
FIG. 5 is a cross-sectional side view of the thermal control unit in which the cooling member is in contact with the thermal plate.
Figure 6:
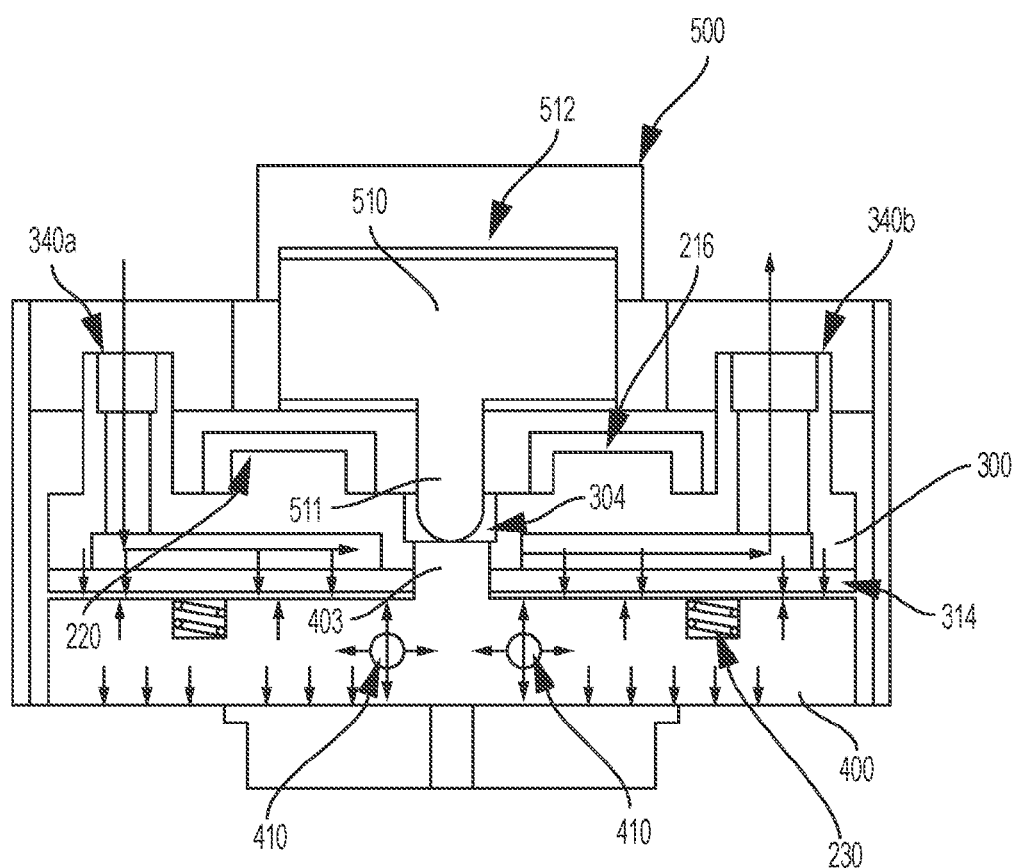
FIG. 6 is another cross-sectional side view of the thermal control unit showing the cooling member being spaced from the thermal plate.
Figure 7:
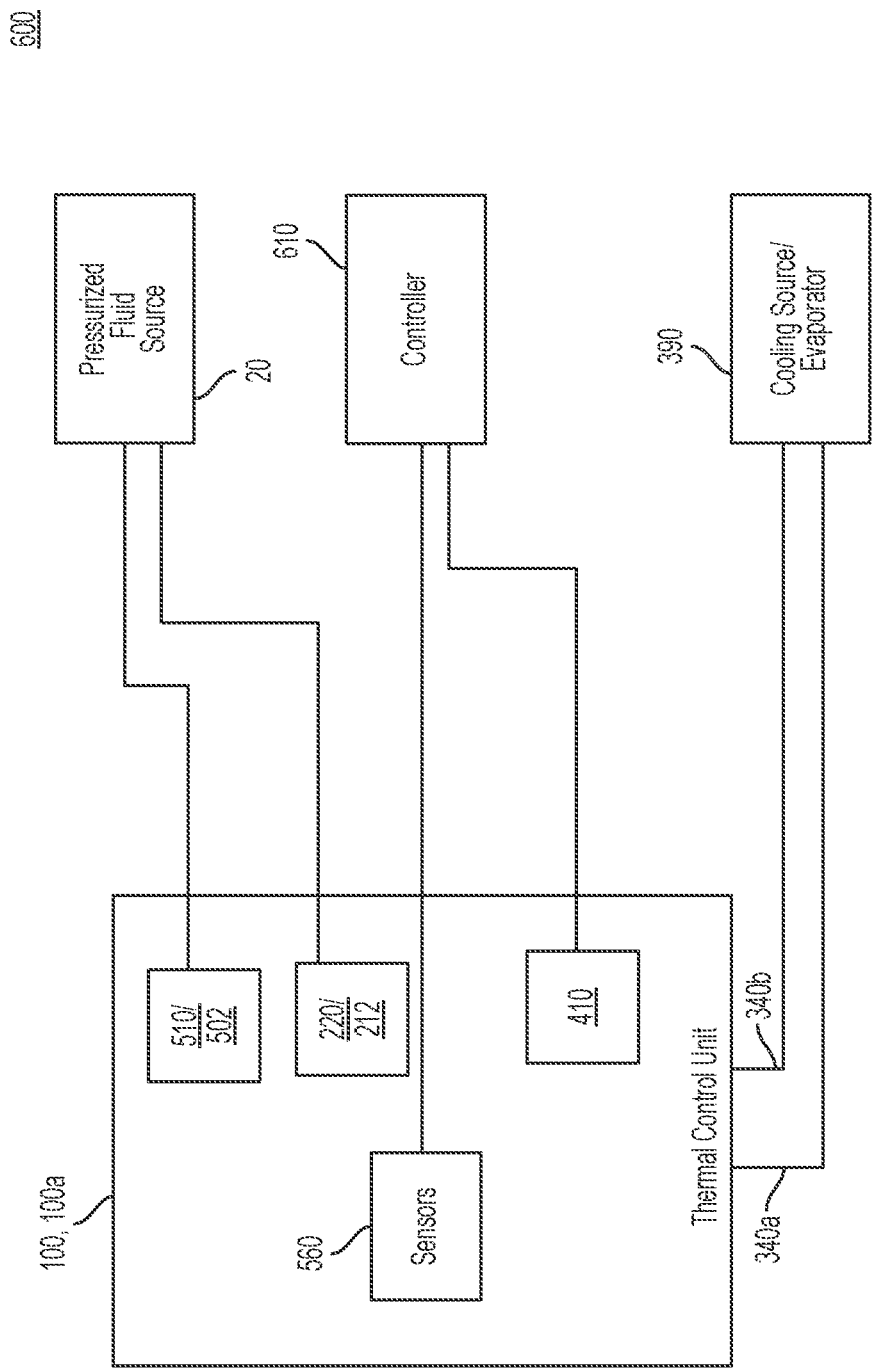
FIG. 7 is an exemplary block diagram of a control system embodying the thermal control unit of the present invention.

Referring now to FIGS. 2-6 there are shown various views of a thermal control unit 100*a* of the present invention that details more completely the thermal clutch 200, cooling source 300 and heat source 400 comprised as part of the thermal control unit. More particularly, there is shown an axonometric view of a thermal control unit 100*a* according to aspects/embodiments of the present invention (FIG. 2A); a cross-section axonometric side view of such a thermal control unit 100a (FIG. 2B); an exploded view of such a thermal control unit (FIG. 3); another axonometric cross-sectional view of such a thermal control unit (FIG. 4); a cross-sectional side view of such a thermal control unit in which the cooling member is in contact with the thermal plate (FIG. 5); and another cross-sectional side view of the thermal control unit but showing the cooling member being spaced from the thermal plate (FIG. 6). Such a thermal control unit 100a more particularly includes a housing or case 500 and the features comprising the thermal clutch 200, the cooling source 300 and the heat source 400 which are located within the case 500. Reference also should be made to FIG. 7, which provides an exemplary block diagram of a system 600 embodying the thermal control unit 100, 100a of the present invention.

Figure 2A:
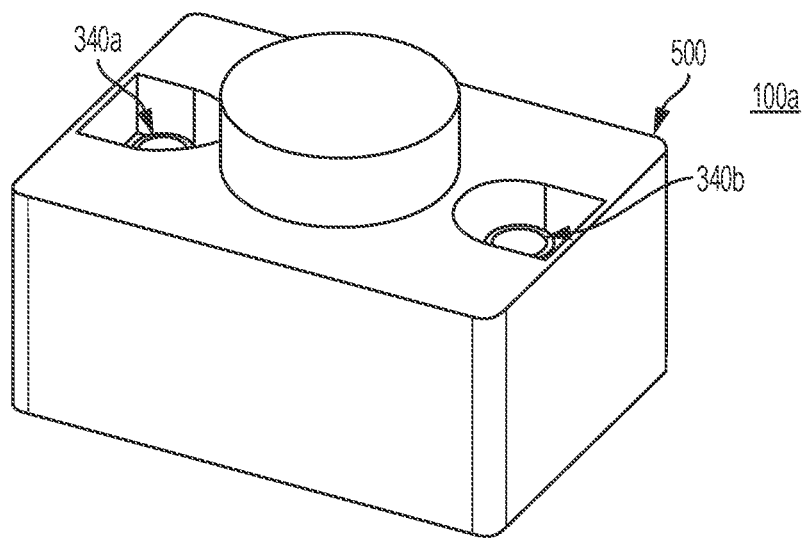
FIG. 2A is an axonometric view of a thermal control unit of the present invention.
Figure 2B:
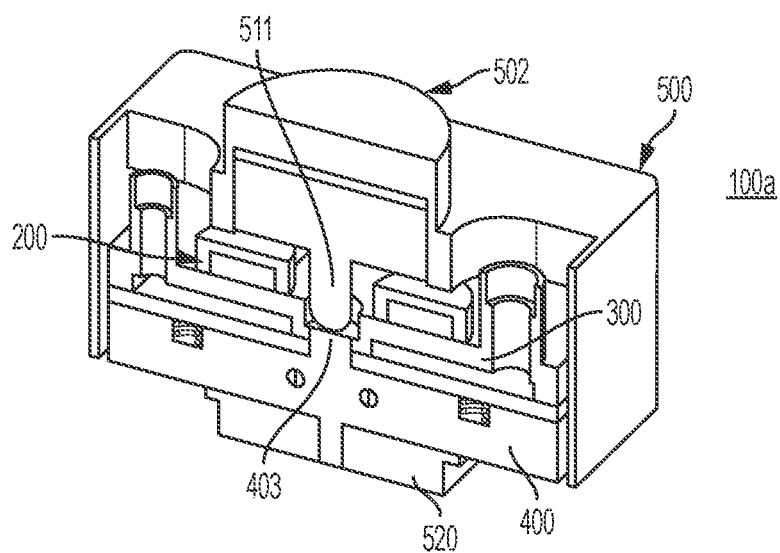
FIG. 2B is a cross-section axonometric side view of the thermal control unit of FIG. 2A.

Such a case 500 embodies a force cylinder assembly that is configured and arranged so as to urge the thermal plate 400 and the interface plate 520 into thermal contact with the DUT 10. The case 500 is more specifically configured and arranged so as include a chamber 502 or compartment therein in which is movably received a piston 510 having a member 511 (e.g., rod like member) that extends axially from the piston. As shown in FIGS. 2B and 4, this axially extending member 511 passes through an aperture 304 in the plate 302 comprising the cooling source 300 and engages a top surface of the thermal plate 402. In more particular illustrative embodiments, the thermal plate 402 includes an upwardly extending member 403 that engages the axially extending member 511.

In exemplary embodiments, the chamber 502 is fluidly coupled to a source of fluid (e.g., pressurized fluid) using any of a number of mechanisms/techniques known to those skilled in the art and in such a way that the piston 510 can be selectively moved in one direction so the axially extending member 511 moves downwardly towards the thermal plate 402 and in another way so that the piston 510 can be selectively moved in a second direction so the axially extending member 511 moves upwardly away from the thermal plate 402. In this way, when the piston 510 moves downwardly towards the thermal plate 402 the axially extending member 511 exerts a downwardly directed force on the thermal plate 402 urging the thermal plate 402 and/or the interface plate 520 into contact with the DUT 10. Correspondingly, when the piston 510 moves upwardly away from the thermal plate 402 the axially extending member 511 no longer exerts a downwardly directed force on the thermal plate 402 and so the thermal plate 402 and/or the interface plate 520 are no longer urged into contact with the DUT 10. In illustrative exemplary embodiments, the pressurized fluid is admitted into a top portion 512 (see FIG. 5) of the chamber 502 so as to create the downwardly directed force.

The thermal clutch 200 includes one or more thermal clutch bridge assemblies 210 that are configured and arranged so as to control movement of the coolant plate 302 in one or more directions to selectively thermally couple and de-couple the coolant plate 302 and the thermal plate 402. Such a thermal clutch 200 also includes one or more moving mechanisms 230 (e.g., springs) that work in conjunction with the one or more thermal clutch bridge assemblies 210 to move the coolant plate 302 in a second direction to thermally de-couple the coolant plate 302 from the thermal plate 402 as further described herein.

In further embodiments, the thermal clutch 200 includes a plurality of clutch bridges assemblies 210, each thermal clutch bridge assembly 210 having a thermal clutch bridge 214. Each thermal clutch bridge 214 can form a generally U-shaped structure that extends widthwise above the coolant plate 302 so as to straddle the coolant plate 302, the legs 211 thereof extending downwardly and so as to be attached to the thermal plate 402.

Each thermal clutch bridge 214 also is configured and arranged so as to include a piston receiving member 212. The piston receiving member 212 is configured and arranged so as to movably receive the piston 220 therein and so as to extend about the piston. Each piston 220 also is arranged so as to engage the coolant plate 302 using any of a number of techniques known to those skilled in the art. In an illustrative exemplary embodiment, the coolant plate 302 is configured and arranged so as to embody the piston(s) 220 in a top surface thereof such that when the thermal control unit 100a is assembled, the piston(s) 220 extend into the piston receiving member 212.

Each piston receiving member 212 forms a chamber that is fluidly coupled to a source of fluid (e.g., pressurized fluid such as gas or a liquid) using any of a number of mechanisms/techniques known to those skilled in the art and in such a way that the piston 220 can be selectively moved in one direction so the coolant plate 302 is thermally coupled to the thermal plate 402. More particularly, when the thermal control unit 100a is to be arranged so as to be in the cooling mode, the piston(s) 220 push the coolant plate 302 into thermal contact with the thermal plate 402 so that the coolant plate 302 can absorb heat energy being developed by the DUT 10 via the thermal plate such as shown in FIG. 5. In illustrative exemplary embodiments, the pressurized fluid is admitted into a top portion 216 (see FIG. 5) of the chamber so as to create a downwardly directed force to move the coolant plate into thermal contact with thermal plate 402.

As indicated herein, the thermal clutch 200 is selectively operated to control the amount or extent of thermal coupling between the cooling source 300 and the DUT 10, more particularly the coolant plate 302 and the thermal plate 402, so as to thereby also control the amount of heat energy being absorbed by the cooling source 300. More particularly, the thermal clutch bridge assemblies 210 are operated in conjunction with the one or more moving mechanisms 230 to controllably move the thermal plate 402 so as to thereby control the amount of engagement between the cooling plate 302 and the thermal plate 402.

In one particular embodiment, the thermal bridge assemblies 210 are controlled so that a predetermined force is exerted on the cooling plate 302 so as to achieve a desired amount of thermal coupling between the cooling plate 302 and the thermal plate 402. In another or second embodiment, the thermal bridge assemblies 210 are controlled so that any one or more of the forces are exerted on the cooling plate 302 by the bridge assemblies 210 so as to also thereby control the amount or extent of engagement and thus thermal coupling between the cooling plate 302 and the thermal plate 402. Such controlling also includes selectively, variably controlling the force being exerted so that there is variable selective thermal coupling between the cooling plate 302 and the thermal plate 402. In yet more specific embodiments, such controlling of the thermal bridge assemblies 210 further includes providing temperature or pressure sensors and monitoring a temperature associated with such thermal coupling or the pressure being exerted by the thermal bridge assemblies 210 and varying the pressure being exerted by the thermal bridge assemblies 210 so as to thereby control the level, extent or amount of thermal coupling. It should be recognized that such thermal coupling also can be controlled so as to allow any of a number of different thermal couplings such as for example a controlled step-change over time.

When the coolant plate 302 is to be thermally de-coupled from the thermal plate 402, such as when the thermal control unit 100a is in a heating mode, the coolant plate 302 and thus also piston(s) 220 are selectively moved in a second direction by the moving mechanism(s) 230 so the coolant plate 302 moves upwardly away from the thermal plate 402. In illustrative exemplary embodiments, the pressure in the top portion 216 is released (using any of a number of techniques known to those skilled in the art) such that the moving mechanism(s) 230 are not restrained by the downward force on the piston(s) 220 exerted when the top portion 216 of chamber is being pressurized.

In more particular embodiments, the moving mechanism(s) 230 comprise springs or other such structures that preferably are compressed when the thermal plate 402 and the coolant plate 302 are in contact with each other and which move axially so as to push the coolant plate 302 away from the thermal plate 402. In yet further embodiments, the opposing surface of the thermal plate 402 and the coolant plate 302 are arranged with depressions or cylindrical apertures in which are received portions or ends of the moving mechanism 230 or springs. Such depressions or cylindrical apertures are configured so as to restrain the moving mechanism 230 or spring from moving laterally when they are being compressed or during relaxation as well as to retain them in the opening/depression when the thermal control unit 100a is assembled. As indicated herein, a variable force can be applied to the cooling plate 302 to control the amount or extent of engagement and thus thermal coupling between the cooling plate 302 and the thermal plate 402.

As the coolant plate 302 and thus the piston(s) 220 move upwardly away from the thermal plate 402, the thermal plate 402 and/or the interface plate 520 are no longer in thermal contact with the coolant plate 302. In more particular embodiments, the movement of the coolant plate 302 with respect to the thermal plate 402 is controlled so that the coolant plate 302 is spaced a predetermined gap 314 from the thermal plate 402 after such movement such as shown in FIG. 6. This gap 314 is sufficient to essentially thermally de-couple the coolant plate 302 from the thermal plate 402 such the coolant plate 302 is not absorbing significant quantities of heat energy being produced by the heat source 400 or heating elements 410.

As indicated herein, in the second operating mode (e.g., heating mode), the cooling source 300 can be operated in any of a number of operating modes. For example, the cooling source 300 can be operated so as to be maintained in a standby condition, an off condition or any other temperature condition that is otherwise appropriate. In the standby or other temperature condition, as the cooling source 300 is not directly thermally coupled to the DUT 10 by the thermal clutch 200, the cooling source 300 is not removing heat energy from the DUT 10 and therefore, is not cooling the DUT 10. Therefore, the cooling source 300 or the can be operated under these conditions in anticipation of another test cycle so as to reduce the testing time as well as any undesirable operational characteristics that might occur when the cooling source 300 is turned off. For example, if using an evaporative type of cooling source 300 there could be an operational time delay between when the unit is turned off and when it can be cycled back on.

As also indicated herein, in illustrative embodiments the coolant plate 302 is part of a coolant evaporator system that uses an evaporator medium or fluid to absorb heat energy and distribute the absorbed heat energy to a heat sink such as atmosphere. Accordingly, the coolant plate 302 is appropriately coupled to a coolant evaporator such that the cooled evaporative medium is received at an inlet 340a and is passed through the coolant plate 302 to absorb the heat energy. The heated medium is discharged through an outlet 340b back to the portion of the evaporative system where the absorbed heat energy is discharged and the evaporative medium is typically compressed before being returned to the coolant plate 302. In further illustrative exemplary embodiments, the inlet 340a and outlet 340b pass through openings or apertures provided in the case 500.

As indicated herein, the heat source 400 comprises the thermal plate 402 and can further include the interface plate 520 or what is sometimes referred to as a pedestal. The thermal plate 402 is made up of one or thermally conductive materials that provide for thermal conduction of heat energy to/from the DUT 10 via the interface plate 520. For example, when the thermal control unit 100a is being operated in the cooling mode heat energy is absorbed from the DUT 10 and is conducted thermally via the thermal plate 402 to the cooling plate 302 and thus to the cooling source 300.

Figure 3:
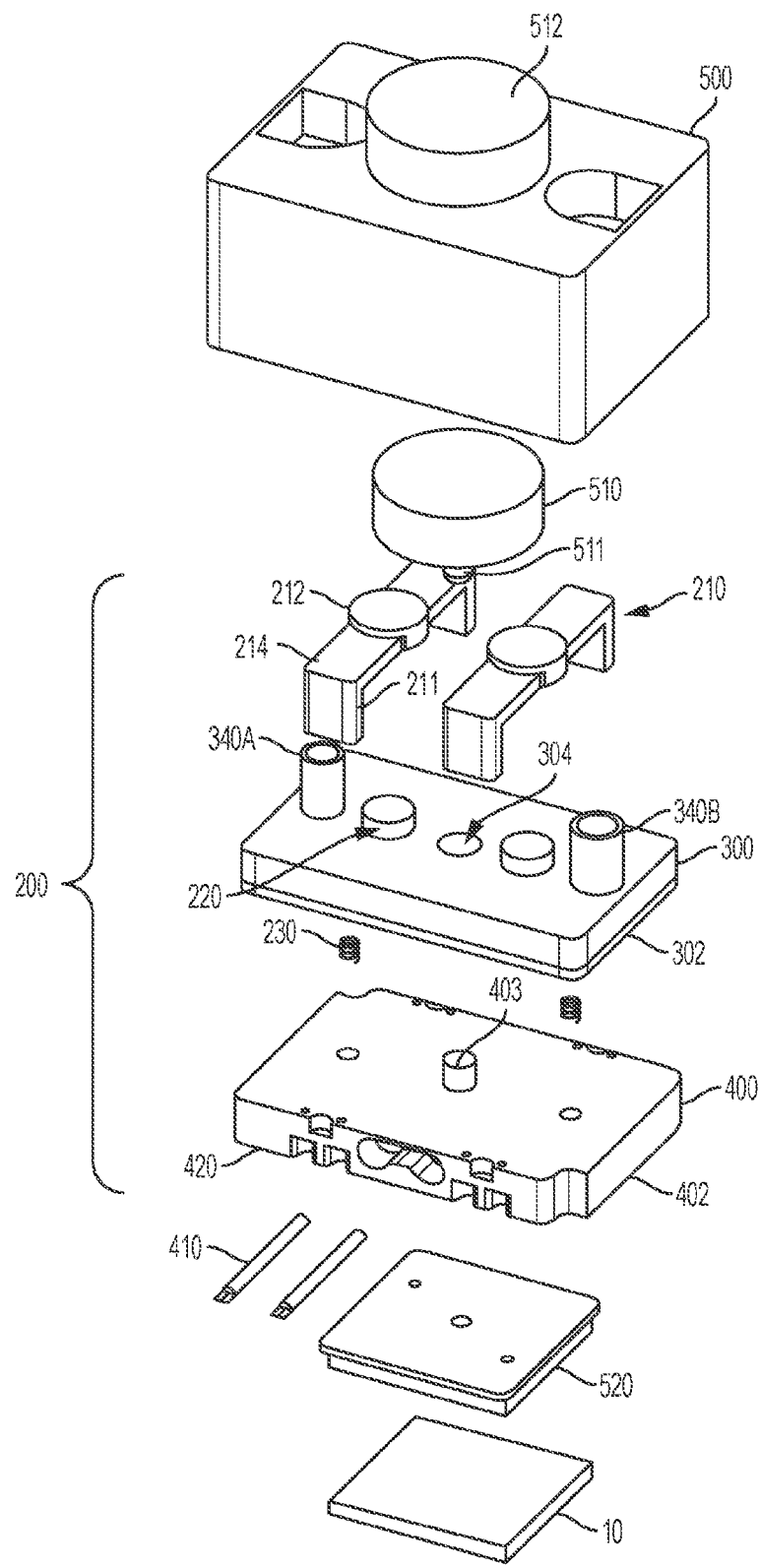
FIG. 3 is an exploded view of the thermal control unit as shown in FIGS. 2A, B.

In further embodiments, the thermal plate 402 and/or the interface plate 520 are configured so as to contain the heaters 410 or heating elements. The heaters 410 are located in the thermal plate 402 and/or interface plate 520 using any of a number of techniques known to those skilled in the art and otherwise appropriate for the intended use. In illustrative exemplary embodiments, the heaters 410 or heating elements are cylindrical in shape (such as shown in FIG. 3) and the thermal plate 402 and/or the interface plate 520 include one or more apertures 415 or cylindrical openings therein (one for each heater 410) to receive the heaters 410 therein. In further exemplary embodiments, the heaters 410 are electric resistance type of heaters that generate heat energy responsive to the current flowing though the resistive elements comprising the heater 410.

In more particular embodiments, one or more, more specifically a plurality or a multiplicity of heaters 410 or heating elements are located in the thermal plate 402 and/or the interface plate 520. In yet more specific embodiments, the heating source 400 more particularly includes two or four heating elements 410 (see for example, FIGS. 3 and 8B).

The interface plate 520 also is composed of a thermal conductive materials so that heat energy can be delivered to the DUT 10 or absorbed by the coolant plate 302 via the interface plate 520 and thermal plate 402. The interface plate 520 also is configured and arranged so as to provide a surface that complements the opposing surface of the DUT 10 for testing. In this way, different DUTs can be tested by using the interface plate 520 that is appropriate for a given DUT 10 which also is configured so it can be thermally coupled to the thermal plate 402 for a given test device.

Referring now to FIG. 7 there is shown an exemplary block diagram of a system 600 embodying the thermal control unit 100, 100a according to the present invention. Such a system includes a pressurized fluid source 20 such as a source of compressed gas or compressed liquid which can be coupled to the appropriate piston-chamber combination (220/212; 510/502) so the pistons 220, 510 can be moved to develop the desired forces as described herein. As indicated herein the cooling plate 302 is fluidly coupled to a variable heat sink or coolant evaporator 390 so that a cooling medium can be delivered to the cooling plate 302 to absorb heat energy and the heated medium can be returned to the coolant evaporator 390 so that the absorbed heat energy can be dissipated to a heat sink such as the atmosphere or another fluid medium (e.g., air/water). In exemplary embodiments, the coolant medium being delivered to the cooling plate 302 is in a liquid state which changes to a gaseous state when it absorbs heat energy. When the gaseous medium is returned to the coolant evaporator 390, the gaseous medium gives up the absorbed heat energy and is typically compressed so as to be returned to the liquid state.

The thermal control unit 100, 100a also includes one or more sensors 560 that are appropriately located within the thermal control unit 100, 100a and/or the DUT 10 so as to measure any of a number of operational parameters and to provide any output of same to a controller 610. The controller 610 controls operation of the pressurized fluid source, the cooling source 300 or coolant evaporator 390 and the thermal control unit 100, 100a including the heaters 410. The controller 610 also is any of a number of digital processing units, microprocessor control devices or application specific integrated circuits as are known in the art that controls such functionalities using hardware and/or software. Such operational parameters include, but are limited to; DUT temperature, pressure of the fluid acting on the pistons and operational outputs from the coolant evaporator 390.

In more particular embodiments, the thermal control unit 100, 100a is configured and arranged so as to control (e.g., variable control) the thermal bridge assemblies 210. More specifically, the thermal control unit 100, 100a further includes temperature and/or pressure sensors 560 so as to be capable of monitoring a temperature associated with thermal coupling and/or the pressure being exerted by the thermal bridge assemblies 210 on the cooling plate 302 or associated therewith. The thermal control unit 100, 100a responds to such inputs and controls the thermal bridge assemblies 210 so as to thereby also control the pressure or force being exerted by the thermal bridge assemblies 210 on the cooling plate 302. In further embodiments, the thermal control unit 100, 100a selectively and variably controls the thermal bridge assemblies 210 so that a varying force is applied to the cooling plate 302 so as to thereby control the level, extent or amount of thermal coupling between the cooling plate 302 and the thermal plate 402. In yet more particular embodiments, the amount of thermal coupling is controllable varied during a test procedure for a given integrated chip or DUT.

Figure 8A:
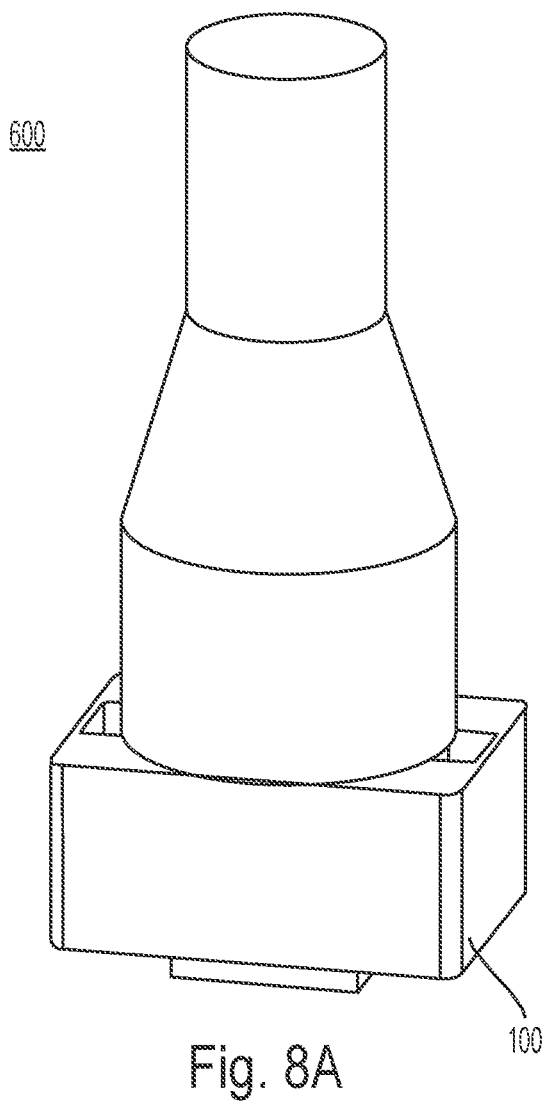
FIG. 8A is an illustrative view of an exemplary testing device embodying the thermal control unit of the present invention.
Figure 8B:
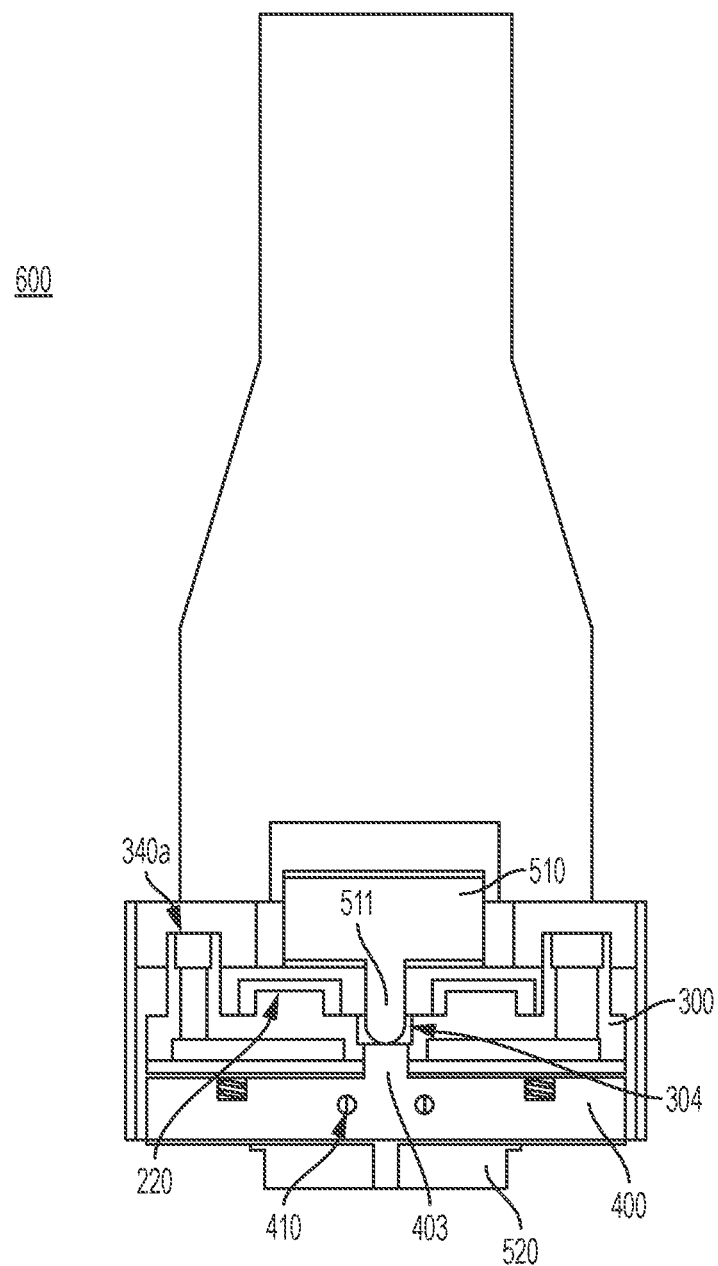
FIG. 8B is another illustrative view showing a cross-sectional side view of the exemplary testing device of FIG. 8A.

Referring now to FIGS. 8A, B, there are shown an illustrative view of an exemplary testing device 700 embodying the thermal control unit 100, 100a of the present invention (FIG. 8A) and another illustrative view showing a cross-sectional side view of the exemplary testing device more particularly showing the thermal control unit 100, 100a embodied in the testing device (FIG. 8B). The interface plate 520 for such a testing device is thermally coupled to the DUT and the thermal control unit 100, 100a as described herein so the testing device can control operational conditions (e.g., temperature conditions and operational parameters such as voltage and current) and so as to measure desired operational parameters. In this regard, the testing device can further include a DUT board or other interface board so as to couple the electrical circuitry and components thereof to measure and/or monitor electrical operational parameters or characteristics of the circuitry and/or components.

Although a preferred embodiment of the invention has been described using specific terms, such description is for illustrative purposes only, and it is to be understood that changes and variations may be made without departing from the spirit or scope of the following claims.

Incorporation by Reference

All patents, published patent applications and other references disclosed herein are hereby expressly incorporated by reference in their entireties by reference.

Equivalents

Those skilled in the art will recognize, or be able to ascertain using no more than routine experimentation, many equivalents of the specific embodiments of the invention described herein. Such equivalents are intended to be encompassed by the following claims.

What is claimed is:

1. A method for testing a device under test (DUT) comprising the steps of:
    disposing a thermal clutch adjacent to a variable heat sink that absorbs heat energy and a heat source member that selectively delivers heat energy; and
    selectively operating the thermal clutch in one of a first manner or a second manner, wherein: when operating the thermal clutch in the first manner the thermal clutch causes the variable heat sink to contact the heat source member; and when operating the thermal clutch in the second manner, the thermal clutch creates a separation between the variable heat sink and the heat source member,
    wherein when the thermal clutch is being operated in the second manner, the heat source member is capable of being thermally coupled to the DUT for operation to produce heat energy which is provided to the DUT.

2. The testing method of claim 1, further comprising operating the variable heat sink while the thermal clutch is being operated in the second manner.

3. The testing method of claim 1, wherein when the variable heat sink is thermally coupled to the DUT, the thermal clutch thermally couples the variable heat sink to the heat source member and said method includes configuring the heat source member so it does not generate heat energy.

4. The testing method of claim 1, wherein the variable heat sink comprises a coolant evaporator and said method further includes controlling the coolant evaporator so as to control a temperature of the DUT.

5. The testing method of claim 1, wherein the thermal clutch comprises:
    a first mechanism that is configured to move the variable heat sink in a first direction so as to thermally couple the variable heat sink and the DUT; and
    a second mechanism arranged in between the variable heat sink and the thermal plate that is configured to move the variable heat sink in a second direction so as to thermally de-couple the variable heat sink from the DUT.

6. The testing method of claim 1, wherein the thermal clutch comprises a first mechanism that is configured and arranged to move the variable heat sink in a first direction so as to thermally couple the variable heat sink and the heat source member; and
    a second mechanism arranged in between the variable heat sink and the thermal plate that is configured and arranged to move the variable heat sink in a second direction so as to thermally de-couple the variable heat sink from the heat source member.

7. The testing method of claim 1 further comprising the step of applying a force, by a piston, to the heat source member so as to place the DUT into electrical contact with a device testing apparatus comprising: the heat source member; the variable heat sink; and the thermal clutch, wherein the force being applied is independent of operation of the thermal clutch.

8. The testing method of claim 1, further comprising thermally coupling an adapter member between the heat source member and the DUT.

9. The testing method of claim 1, wherein the DUT is an integrated chip.

* * * * *